United States Patent
Otake et al.

(10) Patent No.: US 12,087,799 B2
(45) Date of Patent: Sep. 10, 2024

(54) SOLID-STATE IMAGING ELEMENT AND ELECTRONIC DEVICE

(71) Applicant: SONY SEMICONDUCTOR SOLUTIONS CORPORATION, Kanagawa (JP)

(72) Inventors: Yusuke Otake, Kanagawa (JP); Toshifumi Wakano, Kanagawa (JP); Takuro Murase, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 678 days.

(21) Appl. No.: 17/273,585

(22) PCT Filed: Sep. 5, 2019

(86) PCT No.: PCT/JP2019/034901
§ 371 (c)(1),
(2) Date: Mar. 4, 2021

(87) PCT Pub. No.: WO2020/059510
PCT Pub. Date: Mar. 26, 2020

(65) Prior Publication Data
US 2021/0343777 A1  Nov. 4, 2021

(30) Foreign Application Priority Data
Sep. 19, 2018  (JP) .................................. 2018-174517

(51) Int. Cl.
*H01L 27/146* (2006.01)
*H01L 27/148* (2006.01)
(Continued)

(52) U.S. Cl.
CPC .. *H01L 27/14643* (2013.01); *H01L 27/14612* (2013.01); *H01L 27/1462* (2013.01);
(Continued)

(58) Field of Classification Search
CPC ......... H01L 27/14643; H01L 27/14612; H01L 27/1462; H01L 27/14636; H01L 27/14831; H04N 25/771; H04N 25/65
See application file for complete search history.

(56) References Cited

U.S. PATENT DOCUMENTS

| | | | |
|---|---|---|---|
| 8,653,566 B2 * | 2/2014 | Ohtsuki | H01L 27/14636 257/233 |
| 2005/0179796 A1 * | 8/2005 | Okita | H01L 27/14609 348/308 |

(Continued)

FOREIGN PATENT DOCUMENTS

| | | |
|---|---|---|
| CN | 107615488 A | 1/2018 |
| JP | 2008-166810 | 7/2008 |

(Continued)

OTHER PUBLICATIONS

International Search Report prepared by the Japan Patent Office on Nov. 18, 2019, for International Application No. PCT/JP2019/034901.

*Primary Examiner* — Ratisha Mehta
*Assistant Examiner* — Brad A Knudson
(74) *Attorney, Agent, or Firm* — SHERIDAN ROSS P.C.

(57) ABSTRACT

The present disclosure relates to a solid-state imaging element and an electronic device capable of increasing the capacitance of a charge holding unit. The solid-state imaging element includes a pixel including a photodiode, an FD that accumulates charges generated in the photodiode, and a charge holding unit that is connected in parallel with the FD. The charge holding unit includes a wiring capacitance formed by parallel running of a first wiring connected to a first potential and a second wiring connected to a second potential different from the first potential. The present dis- (Continued)

closure can be applied to a solid-state imaging element that performs global shutter type imaging.

19 Claims, 18 Drawing Sheets

(51) Int. Cl.
 *H04N 25/65* (2023.01)
 *H04N 25/771* (2023.01)
(52) U.S. Cl.
 CPC .. *H01L 27/14636* (2013.01); *H01L 27/14831* (2013.01); *H04N 25/65* (2023.01); *H04N 25/771* (2023.01)

(56) References Cited

U.S. PATENT DOCUMENTS

| | | |
|---|---|---|
| 2008/0157152 A1 | 7/2008 | Shim |
| 2011/0234830 A1* | 9/2011 | Kiyota ............. H01L 27/14609 348/222.1 |
| 2011/0297814 A1* | 12/2011 | Nakayama ........... H04N 25/778 250/208.1 |
| 2013/0001403 A1 | 1/2013 | Yamakawa |
| 2013/0001650 A1 | 1/2013 | Ohtsuki |
| 2014/0077058 A1 | 3/2014 | Sakano |
| 2014/0151531 A1 | 6/2014 | Yamashita |
| 2015/0077611 A1 | 3/2015 | Yamashita et al. |
| 2015/0319386 A1 | 11/2015 | Brady et al. |
| 2017/0244921 A1 | 8/2017 | Velichko |

FOREIGN PATENT DOCUMENTS

| | | |
|---|---|---|
| JP | 2011-199185 | 10/2011 |
| JP | 2013-033896 | 2/2013 |
| JP | 2014060519 A | 4/2014 |
| JP | 2014112580 A | 6/2014 |
| JP | 2015-056878 | 3/2015 |
| JP | 2017-519352 | 7/2017 |
| JP | 2018064199 A | 4/2018 |
| KR | 10-2004-0093905 | 11/2004 |

* cited by examiner

SOLID-STATE IMAGING ELEMENT AND ELECTRONIC DEVICE

CROSS REFERENCE TO RELATED APPLICATIONS

This application is a national stage application under 35 U.S.C. 371 and claims the benefit of PCT Application No. PCT/JP2019/034901 having an international filing date of 5 Sep. 2019, which designated the United States, which PCT application claimed the benefit of Japanese Patent Application No. 2018-174517, filed 19 Sep. 2018, the entire disclosures of each of which are incorporated herein by reference.

TECHNICAL FIELD

The present disclosure relates to a solid-state imaging element and an electronic device, and more particularly to a solid-state imaging element and an electronic device capable of increasing the capacitance of a charge holding unit.

BACKGROUND ART

Conventionally, there is an image sensor that performs global shutter type imaging in which all pixels simultaneously transfer charges from a photodiode (PD) to a floating diffusion (FD).

Normally, it is known that kTC noise is generated at reset when driving an image sensor.

On the other hand, for example, Patent Document 1 discloses an image sensor that performs a global shutter type imaging including a charge holding unit different from the FD and feeding a signal potential including the kTC noise back to the FD to reduce the kTC noise.

CITATION LIST

Patent Document

Patent Document 1: Japanese Patent Application Laid-Open No. 2018-64199

SUMMARY OF THE INVENTION

Problems to be Solved by the Invention

In the configuration of Patent Document 1, since the kTC noise is reduced by the capacitance distribution of the coupling capacitance between the charge holding unit and the FD, it is necessary to increase the capacitance of the charge holding unit, but Patent Document 1 does not disclose any specific configuration for increasing the capacitance of the charge holding unit.

The present disclosure has been made in view of such a situation, and is intended to increase the capacitance of the charge holding unit.

Solutions to Problems

The solid-state imaging element of the present disclosure is a solid-state imaging element including: a pixel including a photodiode, an FD that accumulates charges generated in the photodiode, and a charge holding unit that is connected in parallel with the FD, in which the charge holding unit includes a wiring capacitance formed by parallel running of a first wiring connected to a first potential and a second wiring connected to a second potential different from the first potential.

The electronic device of the present disclosure is an electronic device including: a solid-state imaging element including a pixel including a photodiode, an FD that accumulates charges generated in the photodiode, and a charge holding unit that is connected in parallel with the FD, in which the charge holding unit includes a wiring capacitance formed by parallel running of a first wiring connected to a first potential and a second wiring connected to a second potential different from the first potential.

According to the present disclosure, a pixel includes a photodiode, an FD that accumulates charges generated in the photodiode, and a charge holding unit that is connected in parallel with the FD, in which the charge holding unit includes a wiring capacitance formed by parallel running of a first wiring connected to a first potential and a second wiring connected to a second potential different from the first potential.

MODE FOR CARRYING OUT THE INVENTION

Modes for carrying out the present disclosure (hereinafter, the embodiments) are described below. Note that description will be presented in the following order.

1. Outline of the technology according to the present disclosure
2. First embodiment (pixel configuration and wiring layout)
3. Second embodiment (example of wirings running in parallel directly above PD)
4. Third embodiment (example using High-K film)
5. Fourth embodiment (example of increasing the area of the diffusion layer)
6. Fifth embodiment (example of boosting the potential of FD)
7. Sixth embodiment (example of making wirings perpendicular between wiring layers)
8. Seventh embodiment (example of forming solid wiring)
9. Eighth embodiment (application to pixels for which conversion efficiency switching is performed)
10. Configuration example of electronic device

1. Outline of the Technology According to the Present Disclosure (Configuration of the Solid-State Imaging Element)

Figure 1:
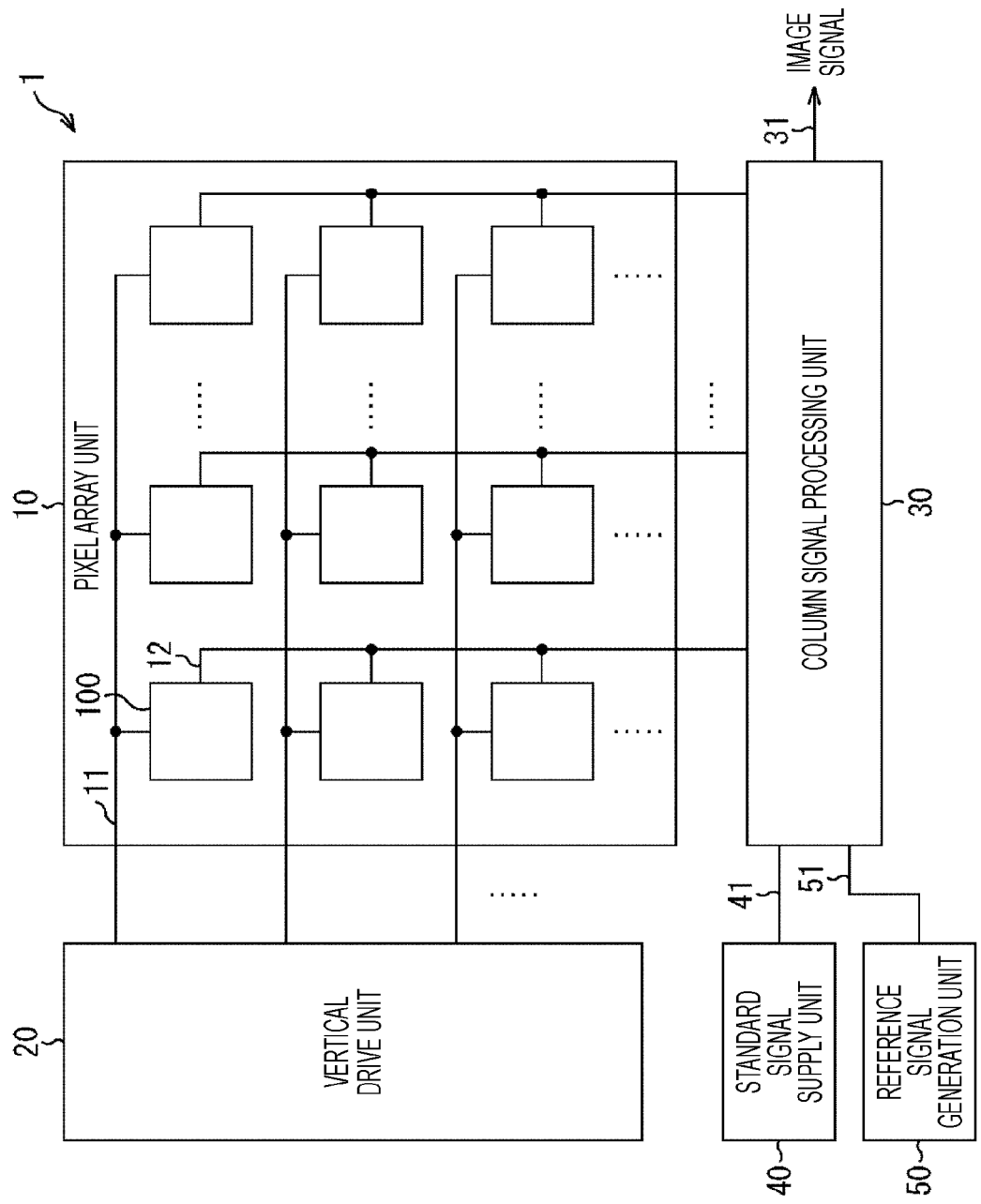
FIG. 1 is a diagram showing a configuration example of a solid-state imaging element to which the technology according to the present disclosure is applied.

FIG. 1 is a diagram showing a configuration example of a solid-state imaging element 1 to which the technology according to the present disclosure is applied.

The solid-state imaging element 1 includes a pixel array unit 10, a vertical drive unit 20, a column signal processing unit 30, a standard signal supply unit 40, and a reference signal generation unit 50.

The pixel array unit 10 generates an image signal according to incident light. The pixel array unit 10 includes pixels 100 having a photoelectric conversion unit in a two-dimensional matrix.

In the pixel array unit 10, a control line 11 for transmitting a control signal to the pixel 100 and a vertical signal line 12 for transmitting an image signal generated by the pixel 100 are wired in an X-Y matrix.

The control line 11 is wired for each row of a plurality of pixels 100. The control line 11 is commonly wired to the pixels 100 arranged in one row. That is, control signals different with respect to each row are input to the pixels 100, and a common control signal is input to the pixels 100 arranged in one row.

On the other hand, the vertical signal line 12 is wired for each column of the plurality of pixels 100. The vertical signal line 12 is commonly wired to the pixels 100 arranged in one column. That is, an image signal of the pixels 100 arranged in one column is transmitted via the common vertical signal line 12.

The vertical drive unit 20 generates a control signal and outputs it to the pixel array unit 10 via the control line 11.

The column signal processing unit 30 processes the image signal output from the pixel array unit 10. The image signal processed by the column signal processing unit 30 corresponds to an output signal of the solid-state imaging element 1, and is output to the outside of the solid-state imaging element 1.

The standard signal supply unit 40 generates a standard signal. The standard signal is a signal that serves as a standard of the image signal generated by the pixel 100, and is, for example, a signal having a voltage corresponding to a black level image signal. The generated standard signal is supplied to the column signal processing unit 30 via a standard signal line 41.

The reference signal generation unit 50 generates a reference signal. The reference signal is a signal serving as a standard for analog-to-digital conversion of the image signal generated by the pixel 100. As the reference signal, for example, a signal whose voltage drops like a lamp can be adopted. The generated reference signal is output to the column signal processing unit 30 via a reference signal line 51.

(Configuration of the Pixel)

Figure 2:
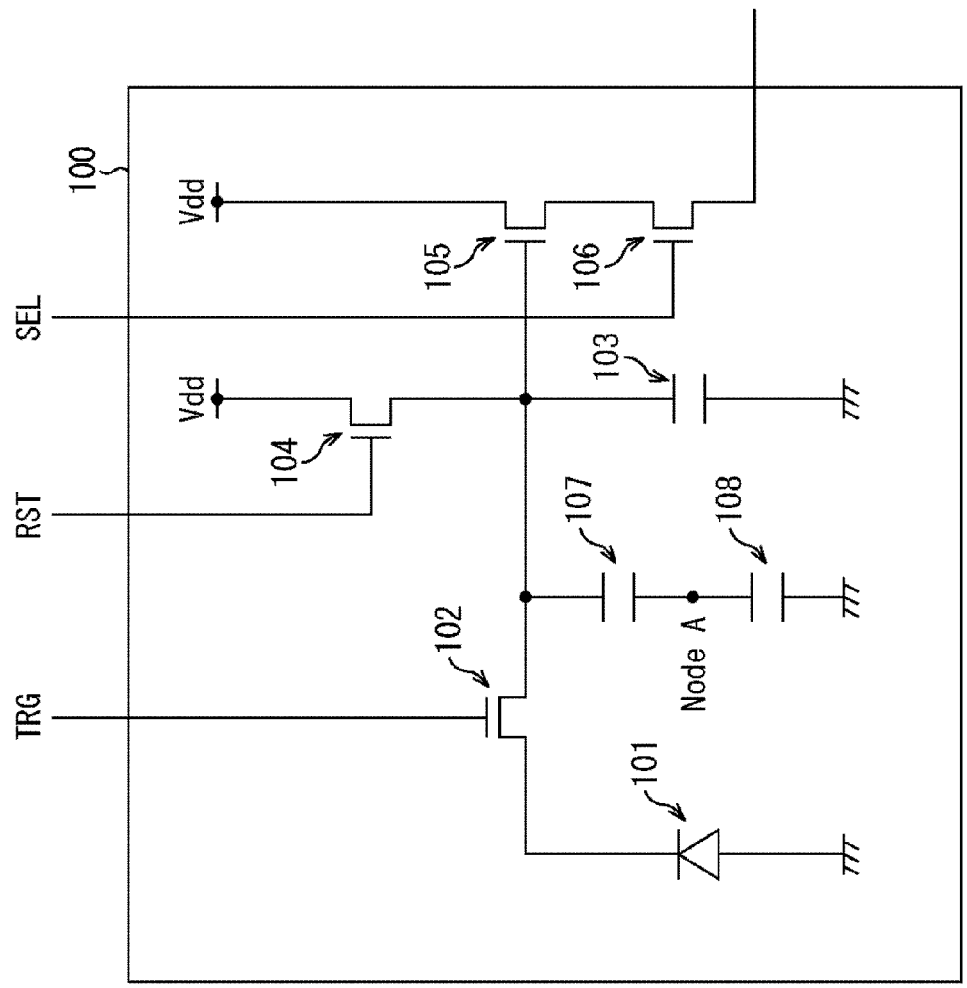
FIG. 2 is a diagram showing a configuration example of a pixel to which the technology according to the present disclosure is applied.

FIG. 2 is a diagram showing a configuration example of the pixel 100 to which the technology described above according to the present disclosure is applied.

The pixel 100 includes a photodiode (PD) 101, a transfer transistor 102, a floating diffusion (FD) 103, a reset transistor 104, an amplification transistor 105, and a selection transistor 106.

A MOS transistor can be used for each pixel transistor: the transfer transistor 102, the reset transistor 104, the amplification transistor 105, and the selection transistor 106.

The control line 11 and the vertical signal line 12 described above are wired to the pixel 100. Among the above, the control line 11 includes a control line transfer gate (TRG), a control line reset (RST), and a control line select (SEL). These control lines are connected to the gate of the MOS transistor and transmit the control signal described in FIG. 1. When a voltage equal to or higher than a threshold voltage between the gate and the source of the MOS transistor is input to these control lines, the corresponding MOS transistor becomes conductive.

The control line TRG transmits a signal for controlling on/off of the transfer transistor 102. The control line RST transmits a signal for controlling the reset of the FD 103. The control line SEL transmits a signal for selecting the pixel 100.

Moreover, a power line Vdd is wired to the pixel 100. The power line Vdd supplies power with positive polarity.

The anode of the PD 101 is grounded and the cathode is connected to the source of the transfer transistor 102. The gate of the transfer transistor 102 is connected to the control line TRG, and the drain is connected to one end of the FD 103, the gate of the amplification transistor 105, and the source of the reset transistor 104. Another end of the FD 103 is grounded.

The drain of the reset transistor 104 is connected to the power line Vdd and the gate is connected to the control line RST. The drain of the amplification transistor 105 is connected to the power line Vdd and the source is connected to the drain of the selection transistor 106. The gate of the selection transistor 106 is connected to the control line SEL and the source is connected to the vertical signal line 12.

The PD 101 generates a charge according to the emitted incident light by photoelectric conversion.

The transfer transistor 102 transfers the charge generated by the PD 101 to the FD 103. The transfer transistor 102 transfers the charge by causing the PD 101 and the FD 103 to be conductive.

The FD 103 accumulates the charge generated in the PD 101. The FD 103 is formed in a diffusion layer of a semiconductor substrate such as a Si substrate and the like.

The reset transistor 104 resets the charge accumulated in the FD 103. The reset transistor 104 applies a power voltage to the FD 103 by conducting the power line Vdd and the FD 103, and resets the FD 103.

The amplification transistor 105 detects a signal corresponding to the charge held in the FD 103 as a pixel signal.

The selection transistor 106 outputs the image signal detected by the amplification transistor 105. The selection transistor 106 outputs an image signal by causing the amplification transistor 105 and the vertical signal line 12 to be conductive.

With the above configuration, the FD 103 is reset and the charge is transferred from the PD 101 to the FD 103 at the same time for all pixels. That is, the solid-state imaging element 1 can perform global shutter type imaging.

The pixel 100 further includes charge holding units 107, 108.

The charge holding units 107, 108 are electrically connected in parallel with the FD 103 and accumulate charges generated in the PD 101 apart from the FD 103.

One end of the charge holding unit 107 is connected to the drain of the transfer transistor 102, the gate of the amplification transistor 105, and the source of the reset transistor 104, and another end is connected to a node A having a predetermined potential. Furthermore, one end of the charge holding unit 108 is connected to the node A, and another end is grounded.

Here, the charge holding units 107, 108 can be formed by the wiring capacitance.

(Wiring Layout that Forms the Charge Holding Unit)

Figure 3:
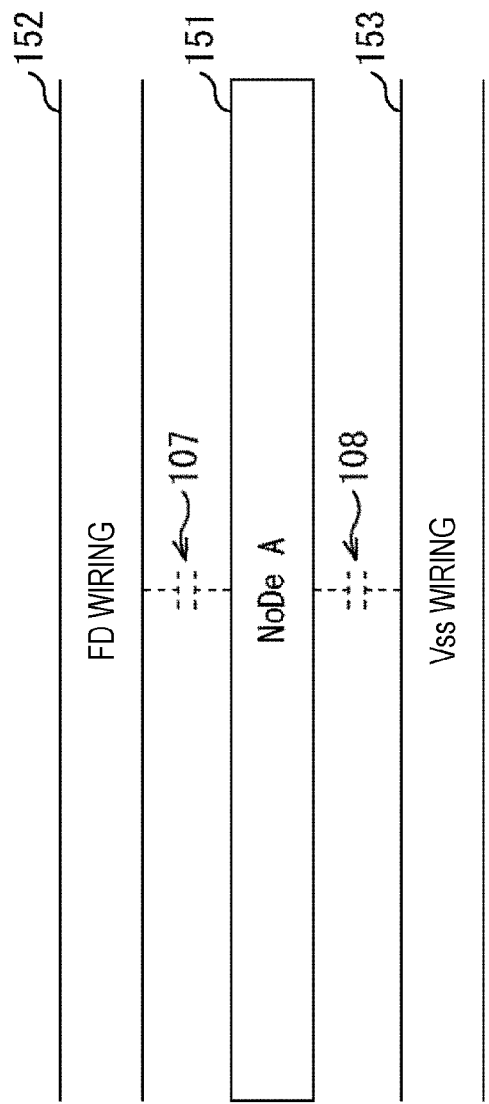
FIG. 3 is a plan view showing an example of a wiring layout for forming a charge holding unit.

FIG. 3 is a plan view showing an example of a wiring layout for forming the charge holding units 107, 108.

FIG. 3 shows the layout of a part of each of a wiring 151 connected to the node A, a FD wiring 152 connecting the drain of the transfer transistor 102 and the gate of the amplification transistor 105, and a fixed potential line 153 connected to the fixed potential Vss different from the node A. Here, the fixed potential Vss is assumed to be a ground potential (GND).

As shown in FIG. 3, the wiring 151, the FD wiring 152, and the fixed potential line 153 are laid out side by side so as to extend in the same direction (right-and-left direction in the drawing). In the following, the fact that wirings X, Y are laid out side by side means that the wirings X, Y run in parallel.

In the example of FIG. 3, the wiring 151 and the FD wiring 152 run in parallel to form the charge holding unit 107, and the wiring 151 and the fixed potential line 153 run in parallel to form the charge holding unit 108.

With such a wiring layout, it is possible to increase the capacitance of the charge holding units 107, 108.

Note that, in the example of FIG. 3, the wiring 151, the FD wiring 152, and the fixed potential line 153 have only a straight portion extending in one direction (hereinafter referred to as an extending portion), but may have a portion bending or branching in a predetermined direction (hereinafter referred to as a bent portion). The bent portion can be formed in any of an L-shape, a T-shape, a U-shape, and a cross shape.

In this case, the two wirings may run in parallel, for example, such that the bent portion of each of the two wirings is bent in the same direction or the bent portion of another wiring is bent so as to surround at least a part of one wiring.

2. First Embodiment (Configuration Example of the Pixel)

Figure 4:
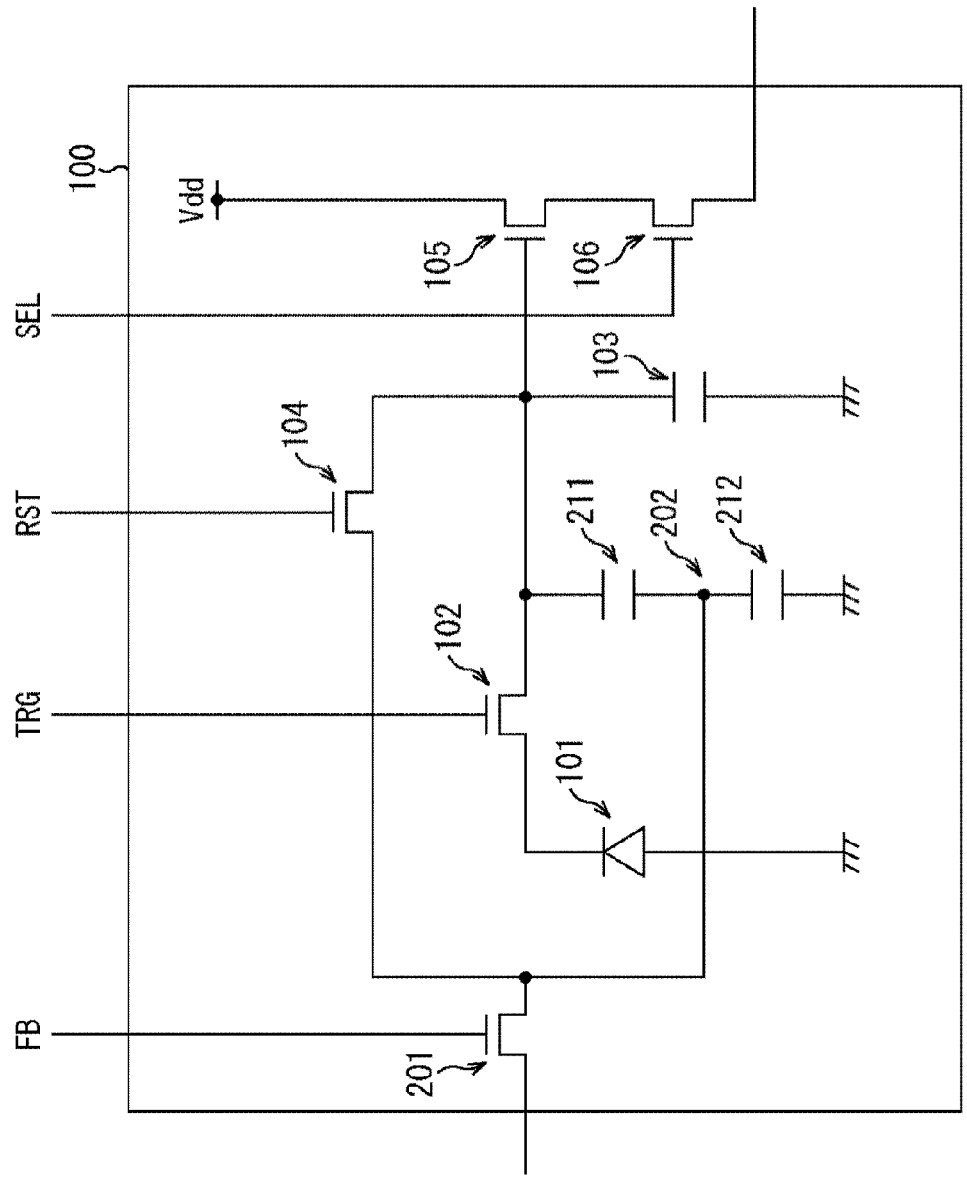
FIG. 4 is a diagram showing a configuration example of a pixel according to a first embodiment of the present disclosure.

FIG. 4 is a diagram showing a configuration example of a pixel 100 according to the first embodiment of the present disclosure.

The pixel 100 of FIG. 4 differs from the pixel 100 of FIG. 2 in that it includes a feedback transistor 201.

A MOS transistor can be used as the feedback transistor 201.

A control line feedback (FB) is further wired as a control line 11 to the pixel 100 of FIG. 4. The control line FB transmits a signal for controlling the supply of a reset voltage. The reset voltage is a voltage input to the pixel 100 when the pixel 100 is reset.

The source of the feedback transistor 201 is connected to the drain of the reset transistor 104 and the node 202 at a predetermined potential. The drain of the feedback transistor 201 is connected to the column signal processing unit 30, and the gate is connected to the control line FB.

A node 202 corresponds to the node A of the pixel 100 of FIG. 2. Furthermore, in the pixel 100 of FIG. 4, charge holding units 211, 212 corresponding to the charge holding units 107, 108 of the pixel 100 of FIG. 2 are formed.

The feedback transistor 201 causes the charge holding unit 212 to hold the reset voltage output from the column signal processing unit 30.

The charge holding unit 212 holds the reset voltage output from the feedback transistor 201.

In the example of FIG. 4, the reset transistor 104 applies a reset voltage to the FD 103 by conducting the charge holding unit 212 and the FD 103, and resets the FD 103.

The charge holding unit 211 transmits the reset voltage held by the charge holding unit 212 to the FD 103.

Normally, the kTC noise remains in the FD 103 at the time of reset. The kTC noise is noise caused by the operation of the reset transistor 104, and is generated when the reset transistor 104 shifts from the conductive state to the non-conductive state. Then, a part of it remains in the FD 103. It is known that the kTC noise can be reduced by reducing the electrostatic capacitance of the FD 103.

In the pixel 100 of FIG. 4, the charge holding units 211, 212 are connected in parallel with the FD 103, and the capacitance of the FD 103 is distributed to the charge holding units 211, 212. Therefore, the kTC noise can be reduced.

Therefore, in the pixel 100 of FIG. 4, it is necessary to increase the capacitance of the charge holding units 211, 212 in order to reduce the kTC noise. Thus, with the pixel 100 of the present embodiment, the capacitance of the charge holding units 211, 212 is increased by the wiring layout.

(Pixel Wiring Layout)

FIGS. 5 to 8 are plan views showing an example of the wiring layout of the wiring layers of the first layer to the fourth layer corresponding to the pixel 100 of FIG. 4.

Figure 5:
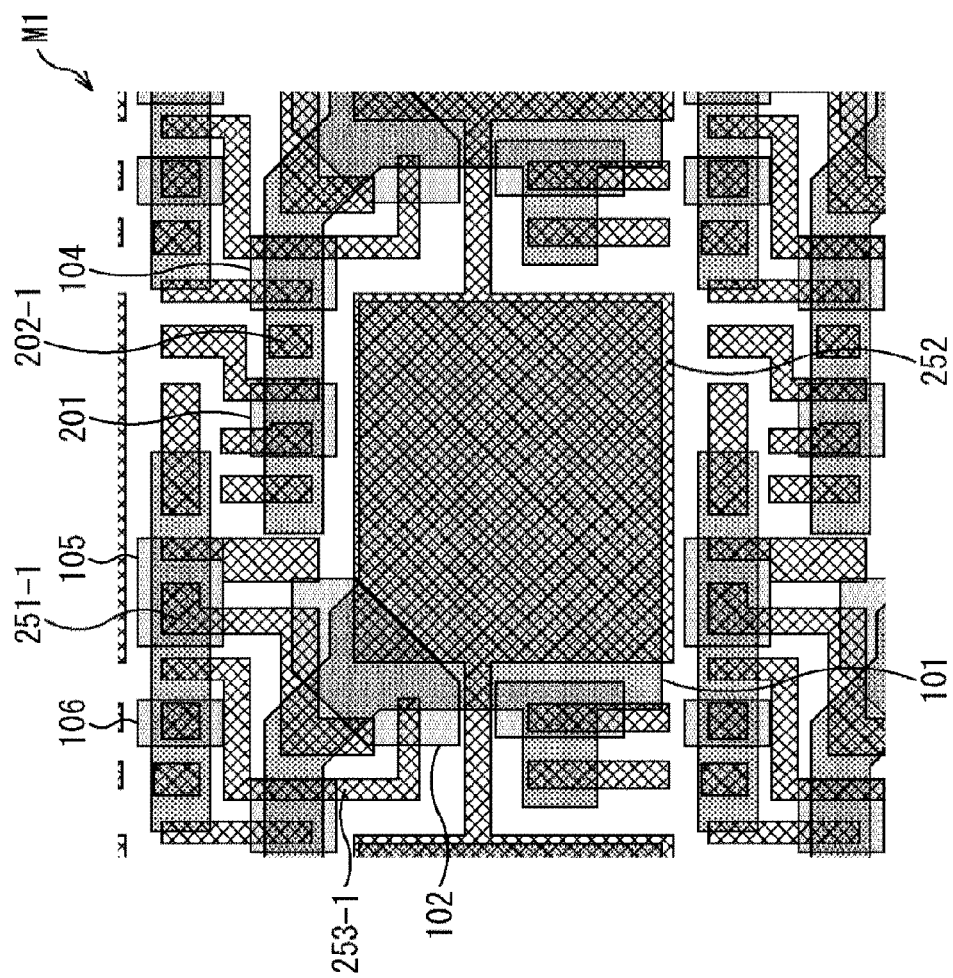
FIG. 5 is a plan view showing an example of a wiring layout of a wiring layer of the first layer.

FIG. 5 shows the wiring layout of a wiring layer M1 of the first layer directly above the Si substrate on which the PD 101 and each pixel transistor are formed.

The PD 101 is arranged substantially in the center of the Si substrate shown in FIG. 5, and the transfer transistor 102 is formed in the upper left part thereof. The amplification transistor 105 and the selection transistor 106 are formed side by side above the transfer transistor 102 in the drawing. The reset transistor 104 and the feedback transistor 201 are formed side by side on the upper right side of the PD 101 in the drawing.

Note that the reset transistor 104 and the feedback transistor 201 are pixel transistors constituting a pixel 100 corresponding to a PD 101, which is not shown, which is adjacent to the right side of the PD 101 shown in FIG. 5. Therefore, a reset transistor 104 and a feedback transistor 201 constituting the pixel 100 corresponding to the PD 101 shown in FIG. 5 are formed on the left side of the PD 101, which is not shown.

In FIG. 5, the wiring pattern of the wiring layer M1 is shown as a diagonal grid pattern.

A FD wiring 251-1 connecting the transfer transistor 102 and the amplification transistor 105 is formed in the wiring layer M1. In the wiring layer M1, directly above the PD 101, a large area pattern 252 for improving the sensitivity of the PD 101 by reflection of incident light is formed.

Furthermore, in the wiring layer M1, on the left side of the FD wiring 251-1 in the drawing, a control line 253-1 for supplying a control signal to the gate of the transfer transistor 102 is formed.

The control line 253-1 is formed so that the extending portion and the bent portion, which are a part of the control line 253-1, run in parallel with the FD wiring 251-1.

Moreover, in the wiring layer M1, at a position sandwiched between the reset transistor 104 and the feedback transistor 201, a wiring 202-1 for transmitting the potential of the node 202 to the wiring layer above the second layer is formed.

Figure 6:
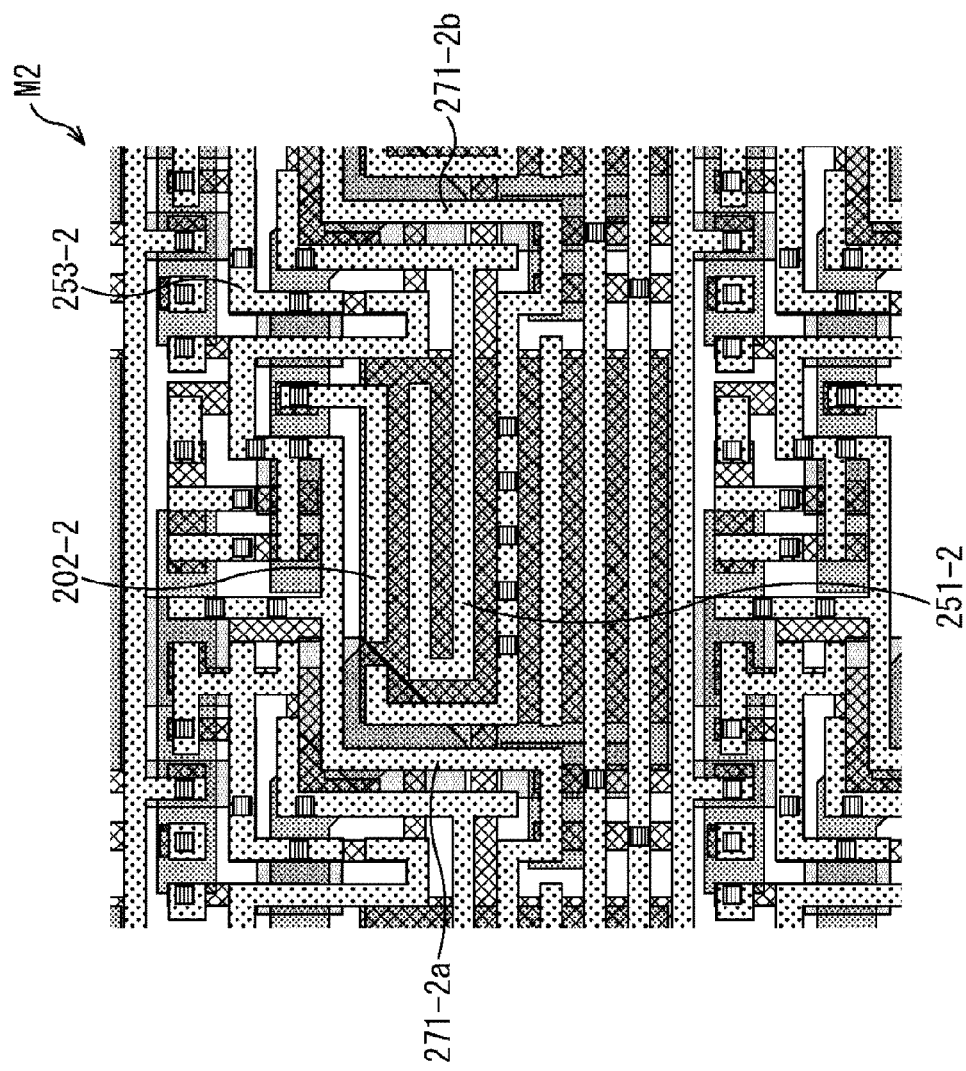
FIG. 6 is a plan view showing an example of a wiring layout of a wiring layer of the second layer.

FIG. 6 shows the wiring layout of the wiring layer M2 of the second layer.

In FIG. 6, the wiring pattern of the wiring layer M2 is shown as a dot pattern.

In the wiring layer M2, a wiring 202-2 that is electrically connected to the wiring 202-1 through a via is formed from the position corresponding to the wiring 202-1 of the wiring layer M1. The wiring 202-2 is generally formed in an L shape.

In the wiring layer M2, a fixed potential line 271-2a connected to a fixed potential Vss (GND) is formed above the wiring 202-2 in the drawing. The fixed potential line 271-2a is formed by combining an extending portion and a plurality of L-shaped, T-shaped, and U-shaped bent portions along the upper side of the wiring 202-2 in the drawing.

The fixed potential line 271-2a is formed so that the extending portion and the bent portion, which are a part of the fixed potential line 271-2a, run in parallel with the wiring 202-2. Therefore, the wiring capacitance is formed between the wiring 202-2 connected to the node 202 and the fixed potential line 271-2a connected to GND.

In the wiring layer M2, an FD wiring 251-2 electrically connected to the FD wiring 251-1 of the wiring layer M1 through a via is formed below the wiring 202-2 in the drawing. The FD wiring 251-2 is formed by combining an extending portion and a plurality of L-shaped, T-shaped, and U-shaped bent portions.

The FD wiring 251-2 is formed so that the extending portion, which is a part of the FD wiring 251-2, runs in parallel with the wiring 202-2. Therefore, the wiring capacitance (coupling capacitance with the FD 103) is formed between the wiring 202-2 connected to the node 202 and the FD wiring 251-2 connected to the FD 103. Note that, in the example of FIG. 6, the wiring 202-2 and the FD wiring 251-2 are wirings corresponding to a pixel 100, which is not shown, adjacent to the right side of the pixel 100 shown in FIG. 6.

In this way, by the wiring capacitance formed by the wiring 202-2, the fixed potential line 271-2a, and the FD wiring 251-2 running in parallel in the wiring layer M2, a high capacitance of the charge holding units 211, 212 can be realized, and eventually the kTC noise can be reduced.

Furthermore, in the wiring layer M2, a fixed potential line 271-2b connected to the fixed potential Vss is formed below the FD wiring 251-2 in the drawing. The fixed potential line 271-2b is formed by combining an extending portion and a plurality of L-shaped and U-shaped bent portions along the left side, the upper side, and the right side of the FD wiring 251-2 in the drawing.

Moreover, in the upper right part of the wiring layer M2 in the drawing, a control line 253-2 that is electrically connected to the control line 253-1 of the wiring layer M1 through a via is formed. The control line 253-2 is generally formed in an L shape.

The FD wiring 251-2 is formed so that the extending portion and the bent portion, which are a part of the FD wiring 251-2, run in parallel with the fixed potential line 271-2b and the control line 253-2. Therefore, a wiring capacitance is also formed between the FD wiring 251-2 connected to the FD 103 and the fixed potential line 271-2b and the control line 253-2.

Here, as shown in FIG. 6, the wiring 202-2 and the FD wiring 251-2, which are the signal lines connected to the FD 103 and the charge holding units 211, 212 that accumulate charges, which become pixel signals, are preferably surrounded by the fixed potential lines 271-2a, 271-2b and the control line 253-2 so as to be shielded from signal lines of adjacent pixels.

Figure 7:
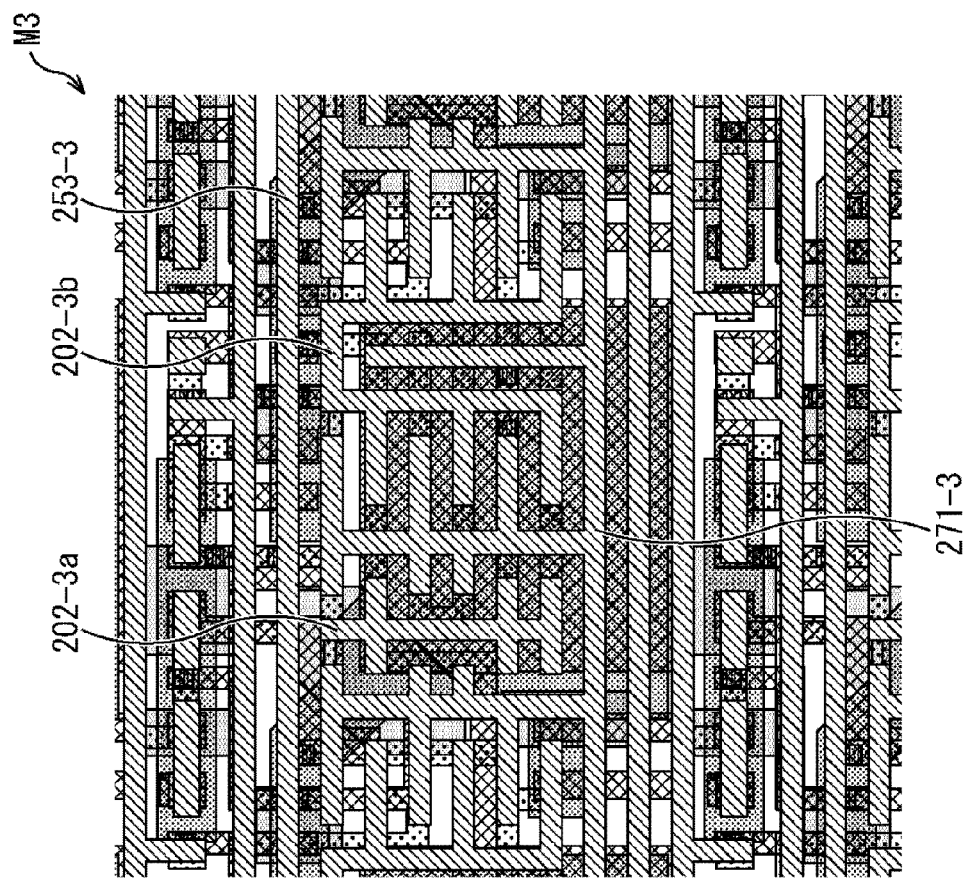
FIG. 7 is a plan view showing an example of a wiring layout of a wiring layer of the third layer.

FIG. 7 shows the wiring layout of the wiring layer M3 of the third layer.

In FIG. 7, the wiring pattern of the wiring layer M3 is shown as an upward-sloping diagonal pattern. As shown in FIG. 7, the wiring pattern of the wiring layer M3 is mainly formed so as to extend in the right-and-left direction in the drawing.

In the wiring layer M3, a wiring 202-3a that is electrically connected to the wiring 202-2 of the wiring layer M2 through a via is formed at the position corresponding to the substantially left half of the PD 101. The wiring 202-3a is formed by combining an extending portion and a plurality of T-shaped and cross-shaped bent portions.

Similarly, in the wiring layer M3, a wiring 202-3b that is electrically connected to the wiring 202-2 of the wiring layer M2 through a via is formed at the position corresponding to the substantially right half of the PD 101. The wiring 202-3b is formed by combining an extending portion and a plurality of L-shaped, T-shaped, and U-shaped bent portions.

Furthermore, in the wiring layer M3, a fixed potential line 271-3 connected to the fixed potential Vss is formed. The fixed potential line 271-3 is formed by combining an extending portion and a plurality of L-shaped, T-shaped, and cross-shaped bent portions so as to surround each of the four sides of the wiring 202-3a, 202-3b.

In particular, the wirings 202-3a, 202-3b and the fixed potential line 271-3 are formed in a comb shape in which a part thereof faces each other.

Moreover, in the wiring layer M3, above the wirings 202-3a, 202-3b and the fixed potential line 271-3 in the drawing, a control line 253-3 that is electrically connected to the control line 253-2 of the wiring layer M2 through a via is formed. The control line 253-3 is formed in a straight line extending in the right-and-left direction in the drawing.

As described above, also in the wiring layer M3, the fixed potential line 271-3 is formed so that the extending portion and the bent portion, which are a part of the fixed potential line 271-3, run in parallel with the wirings 202-3a, 202-3b. Therefore, the wiring capacitance is formed between the wirings 202-3a, 202-3b connected to the node 202 and the fixed potential line 271-3 connected to GND.

Also here, as shown in FIG. 7, the wirings 202-3a, 202-3b, which are the signal lines connected to the charge holding units 211, 212 that accumulate charges, which become pixel signals, are preferably surrounded by the fixed potential line 271-3 and the control line 253-3 so as to be shielded from signal lines of adjacent pixels.

Figure 8:
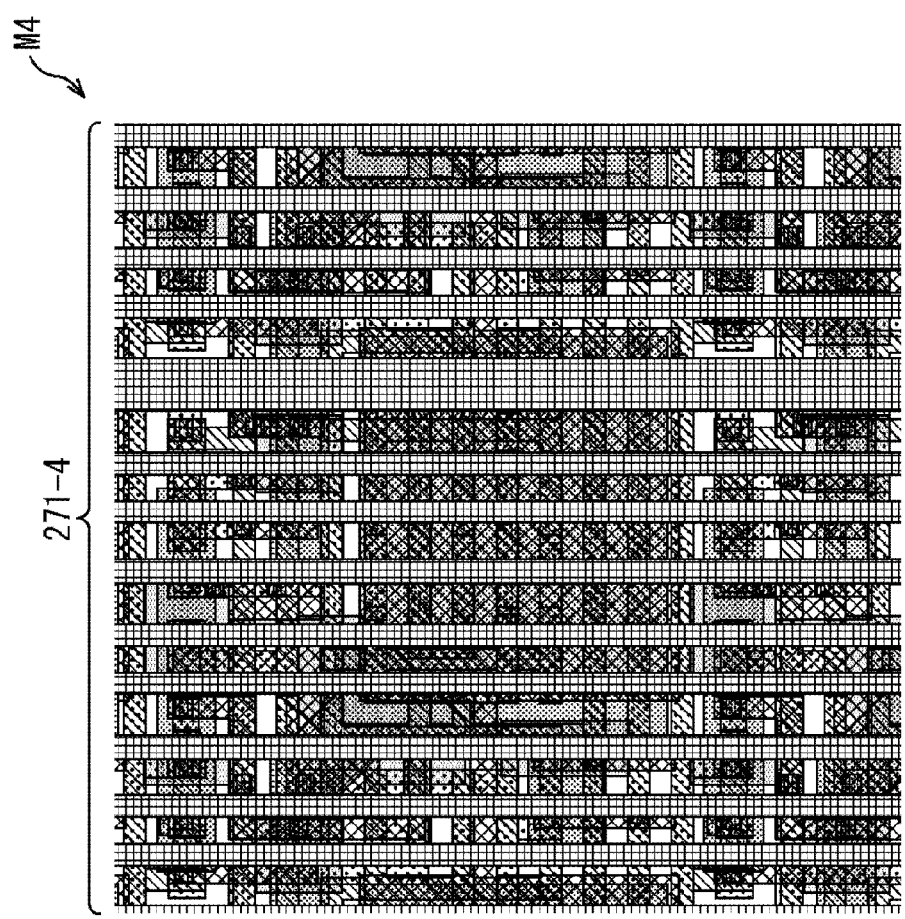
FIG. 8 is a plan view showing an example of a wiring layout of a wiring layer of the fourth layer.

FIG. 8 shows the wiring layout of the wiring layer M4 of the fourth layer.

In FIG. 8, the wiring pattern of the wiring layer M4 is shown as a grid pattern.

In the wiring layer M4, fixed potential lines 271-4 connected to the fixed potential Vss are formed as a plurality of shielded wirings. A plurality of shielded fixed potential lines 271-4 is formed side by side in the right-and-left direction so as to extend in a straight line in the up-and-down direction in the drawing. Therefore, crosstalk between the signal lines connected to the FD 103 and the charge holding units 211, 212 that accumulate charges, which become pixel signals, is suppressed.

Note that the pixel 100 includes the configuration in which a wiring capacitance is formed by wirings running in parallel in the same wiring layer, and also includes the configuration in which a wiring capacitance is formed between different wiring layers.

Figure 9:
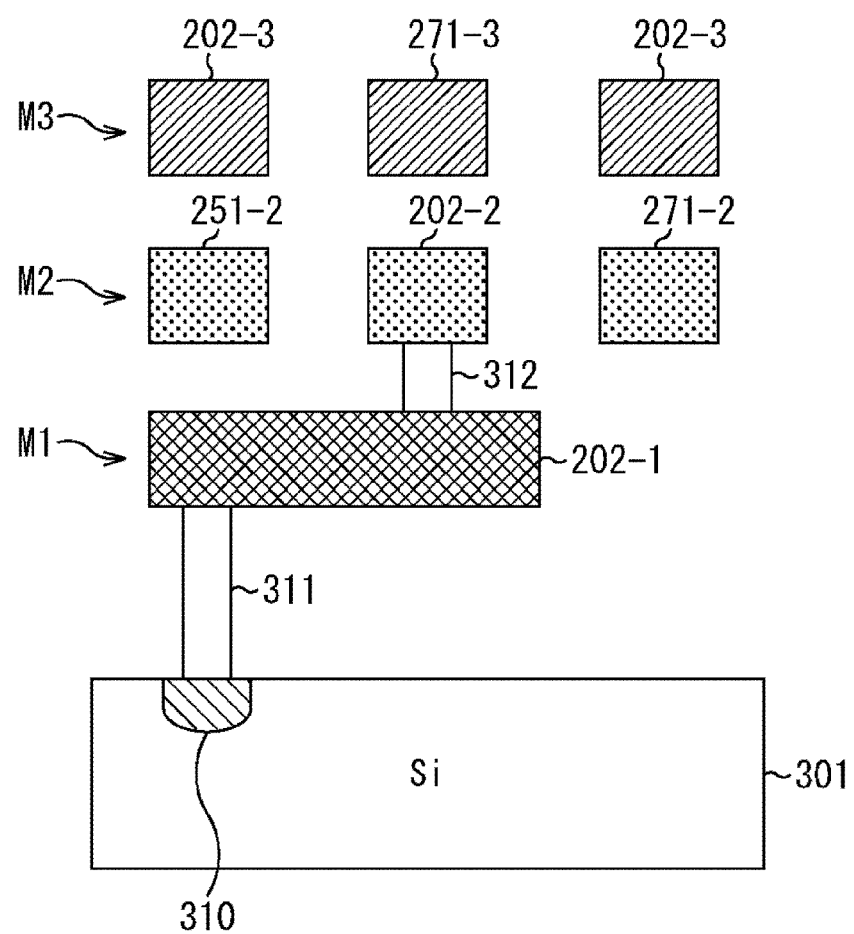
FIG. 9 is a diagram showing an example of a cross section of a wiring layer.

FIG. 9 is a diagram showing an example of a cross section of a wiring layer of the pixel 100.

FIG. 9 shows cross sections of a Si substrate 301 and wirings in the wiring layers M1 to M3.

On the Si substrate 301, an N-type diffusion layer 310 serving as the node 202 is formed within a large P-type diffusion layer formed. The diffusion layer 310 formed on the Si substrate 301 and the wiring 202-1 of the wiring layer M1 are connected by a contact 311. Furthermore, the wiring 202-1 of the wiring layer M1 and the wiring 202-2 of the wiring layer M2 are connected by a via 312.

In the example of FIG. 9, within the wiring layer M2, the wiring 202-2 having a predetermined potential, the fixed potential line 271-2, and the FD wiring 251-2 run in parallel. Furthermore, within the wiring layer M3, the wiring 202-3 having a predetermined potential and the fixed potential line 271-3 run in parallel.

Moreover, in the example of FIG. 9, between the wiring layer M2 and the wiring layer M3, the wiring 202-2 having a predetermined potential and the fixed potential line 271-3 run in parallel, and the fixed potential line 271-2 and the wiring 202-3 having a predetermined potential run in parallel.

As described above, in the pixel 100 of the present embodiment, the wiring capacitance is formed by running the wirings in parallel not only within the same wiring layer but also between different wiring layers.

According to the above configuration, the high capacitance of the charge holding unit connected in parallel with the FD can be realized by the wiring capacitance formed by the wiring connected to the node having a predetermined voltage, the fixed potential line, and the FD wiring running in parallel, and eventually the kTC noise can be reduced.

Note that it is desirable that the wiring patterns of the wiring layers M1 to M4 described above are formed in the same wiring layout for all the pixels 100. Therefore, the sensitivity non-uniformity between the pixels 100 can be reduced.

3. Second Embodiment

In a solid-state imaging element that performs global shutter type imaging, a read circuit cannot be shared between pixels. Therefore, it has been necessary to reduce the voltage amplitude of the pixel signal so that the pixel signal can be received in the subsequent circuit. For that purpose, it has been necessary to intentionally lower the conversion efficiency by increasing the capacitance of the FD.

However, when the pixel size becomes small, the FD wiring routing area becomes narrow, so that it becomes difficult to increase the FD capacitance, and it becomes difficult to realize the intended conversion efficiency.

On the other hand, in order to increase the quantum efficiency of the PD formed on the Si substrate in a case where the wavelength to be captured is a long wavelength, in the above-described embodiment, as described with reference to FIG. 5, the large area pattern 252 for improving the sensitivity of PD by the reflection of incident light is formed directly above the PD.

In the present embodiment, instead of the large area pattern, wirings running in parallel are formed directly above the PD.

Figure 10:
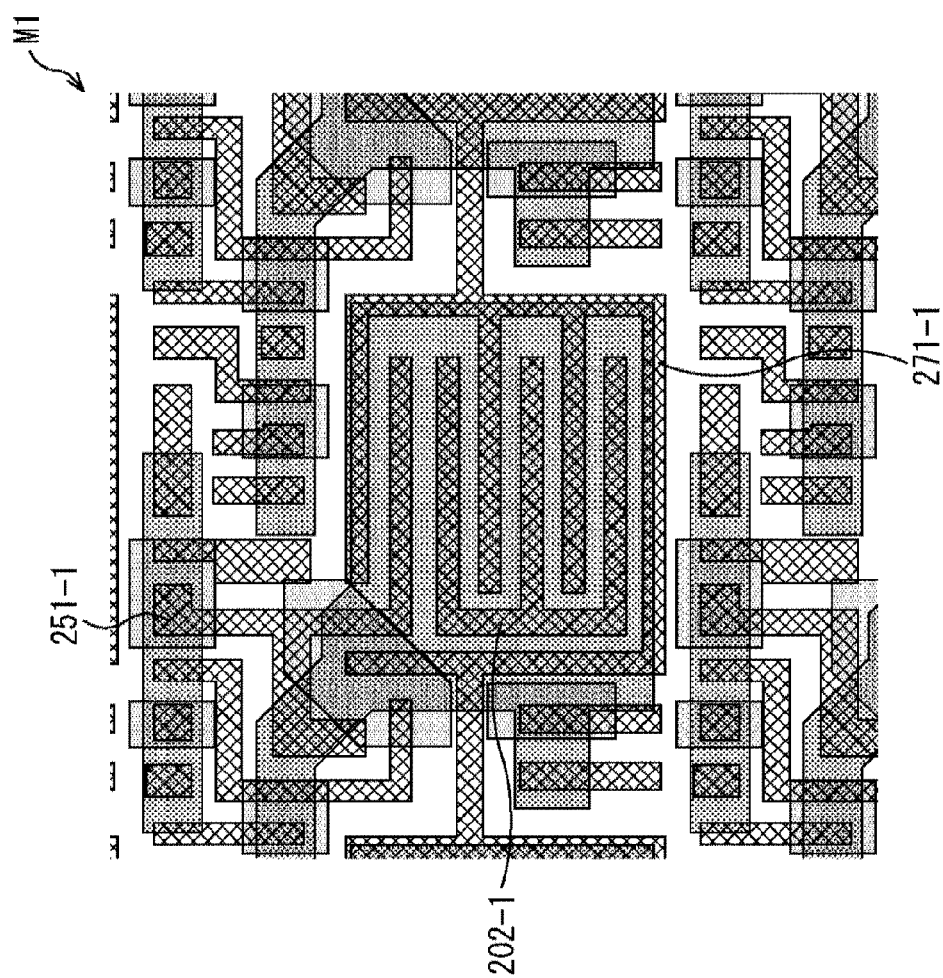
FIG. 10 is a diagram explaining a pixel of a second embodiment of the present disclosure.

FIG. 10 is a plan view showing another example of the wiring layout of the wiring layer M1 of the first layer corresponding to the pixel 100.

In the example of FIG. 10, in the wiring layer M1, the wiring 202-1 having a predetermined potential, the FD wiring 251-1, and the fixed potential line 271-1 are formed directly above the PD 101.

Directly above the PD 101, the wiring 202-1 having a comb shape and a part of the FD wiring 251-1 having an L-shape are formed to run in parallel, and the fixed potential line 271-1 having a comb shape is formed to surround the wiring 202-1 and the FD wiring 251-1. In particular, the wiring 202-1 and the fixed potential line 271-1 are formed so that the comb-shaped portions face each other.

The wiring 202-1, the FD wiring 251-1, and the fixed potential line 271-1 directly above the PD 101 are formed so that the L/S (line width of the pattern and the distance between the patterns) becomes narrower than the wavelength to be captured.

With such a configuration, even in a case where the pixel size is small, it is possible to improve the sensitivity of the PD by reflection of incident light and increase the capacitance of the FD and the charge holding unit.

Note that, also in the example of FIG. 10, it is desirable that the wiring pattern of the wiring layer M1 is formed in the same wiring layout for all the pixels 100. Therefore, the sensitivity non-uniformity between the pixels 100 can be reduced.

4. Third Embodiment

Figure 11:
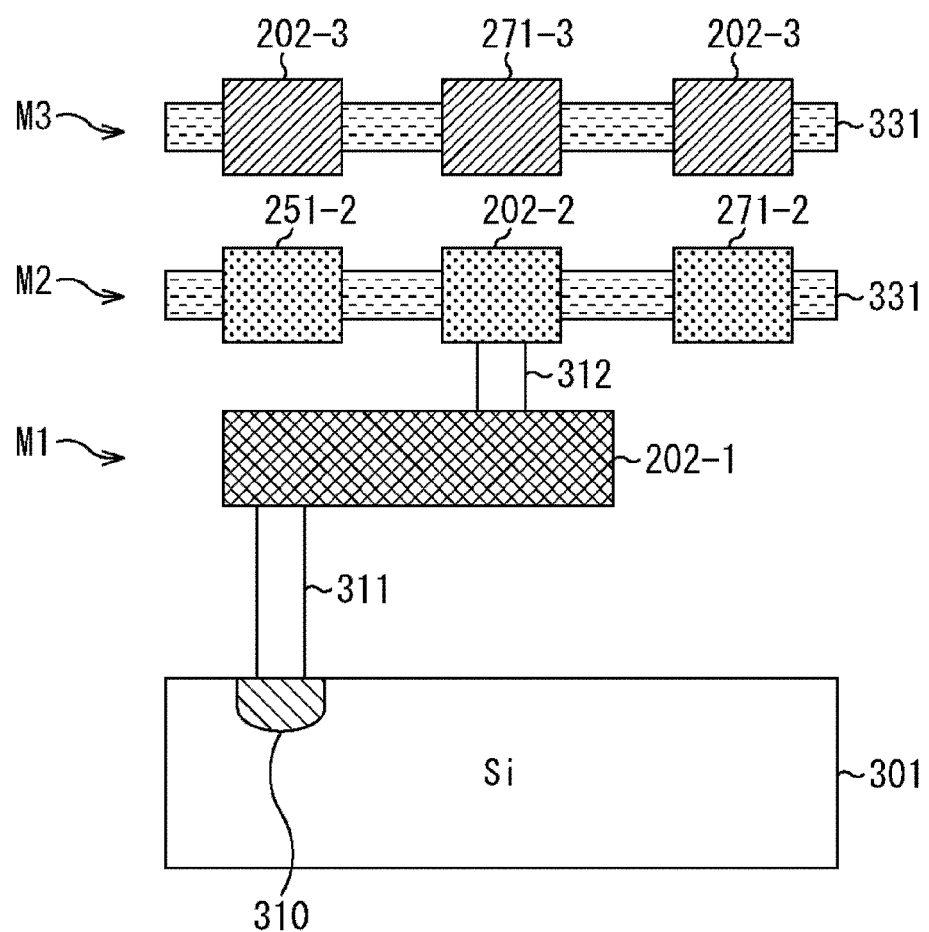
FIG. 11 is a diagram explaining a pixel of a third embodiment of the present disclosure.

FIG. 11 is a diagram showing another example of the cross section of the wiring layer of the pixel 100.

In the example of FIG. 11, a high-k film 331 having a high dielectric constant is provided as an insulating film between the wirings forming the wiring capacitance in the wiring layers M2, M3.

Therefore, it is possible to increase the wiring capacitance formed by the wirings running in parallel.

Note that, by not using a high-k film as an insulating film for a wiring layer (for example, wiring layer M4) in which wirings running in parallel are not formed (where it is not necessary to form a wiring capacitance), an unintended increase in wiring capacitance can be suppressed.

5. Fourth Embodiment

Figure 12:
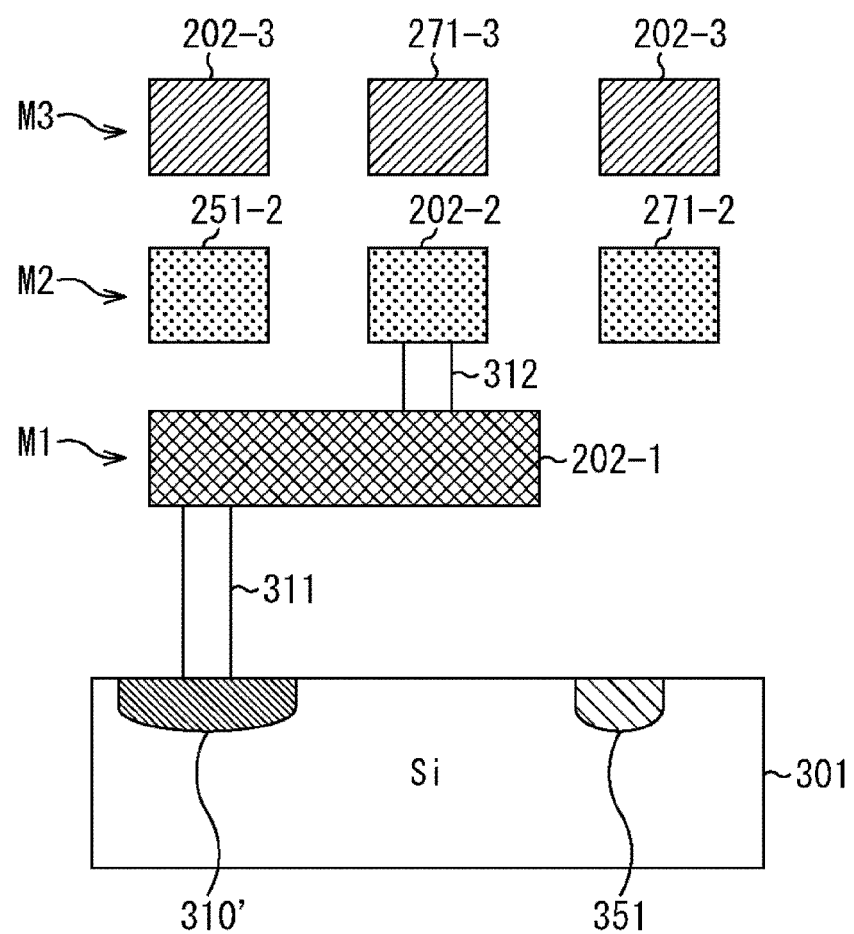
FIG. 12 is a diagram explaining a pixel of a fourth embodiment of the present disclosure.

FIG. 12 is a diagram showing still another example of the cross section of the wiring layer of the pixel 100.

In the example of FIG. 12, a diffusion layer 310' is formed on the Si substrate 301 instead of the diffusion layer 310. The diffusion layer 310' is formed to have a larger area than the diffusion layer 351 forming the pixel transistor.

Moreover, the diffusion layer 310' may be formed by implanting ions having a concentration higher than that of the diffusion layer 351 forming the pixel transistor.

Therefore, it is possible to increase the capacitance of the charge holding unit with a configuration other than running the wirings in parallel.

6. Fifth Embodiment

Figure 13:
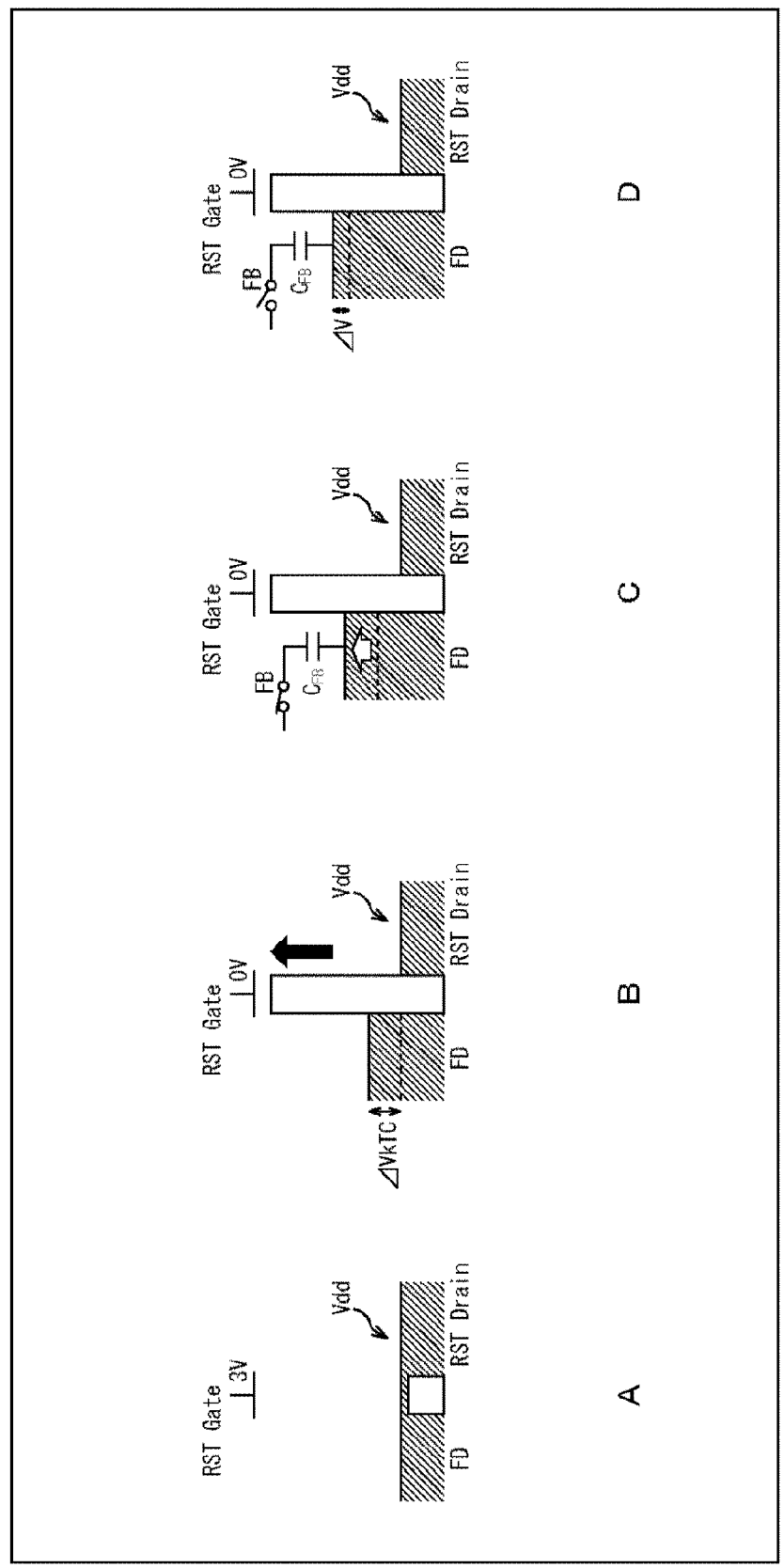
FIG. 13 is a diagram explaining a pixel of a fifth embodiment of the present disclosure.

FIG. 13 is a diagram explaining removal of kTC noise in the pixel 100 that performs the global shutter operation.

First, as shown in A of FIG. 13, when the reset transistor (RST) is turned on, the potential of the FD is reset.

Next, as shown in B of FIG. 13, when the reset transistor (RST) is turned off, kTC noise (ΔVkTC) remains in the FD.

Thereafter, as shown in C of FIG. 13, when the feedback transistor (FB) is turned on, the potential of the FD and the standard signal are balanced, and the kTC noise remaining in the FD is removed.

Moreover, as shown in D of FIG. 13, when the feedback transistor (FB) is turned off, kTC noise (AV) remains in the FD again. However, the kTC noise is reduced by the capacitance distribution of the coupling capacitance between capacitance $C_{FB}$ of the charge holding unit and the capacitance of the FD.

Although the kTC noise at the time of reset can be reduced by the above operation, the potential of the FD becomes shallower than that of a normal pixel, and a transfer failure occurs.

Therefore, in the wiring layer M1 of FIG. 5, the FD wiring 251-1 and the control line 253-1 that supplies the control signal to the gate of the transfer transistor 102 are formed to run in parallel.

Furthermore, in the wiring layer M2 of FIG. 6, the FD wiring 251-2 and the control line 253-2 connected to the control line 253-1 are formed to run in parallel.

Therefore, when the transfer transistor 102 is turned on, the potential of the FD can be boosted by the coupling, and the transfer failure due to the potential of the FD being shallower can be improved.

7. Sixth Embodiment

Figure 14:
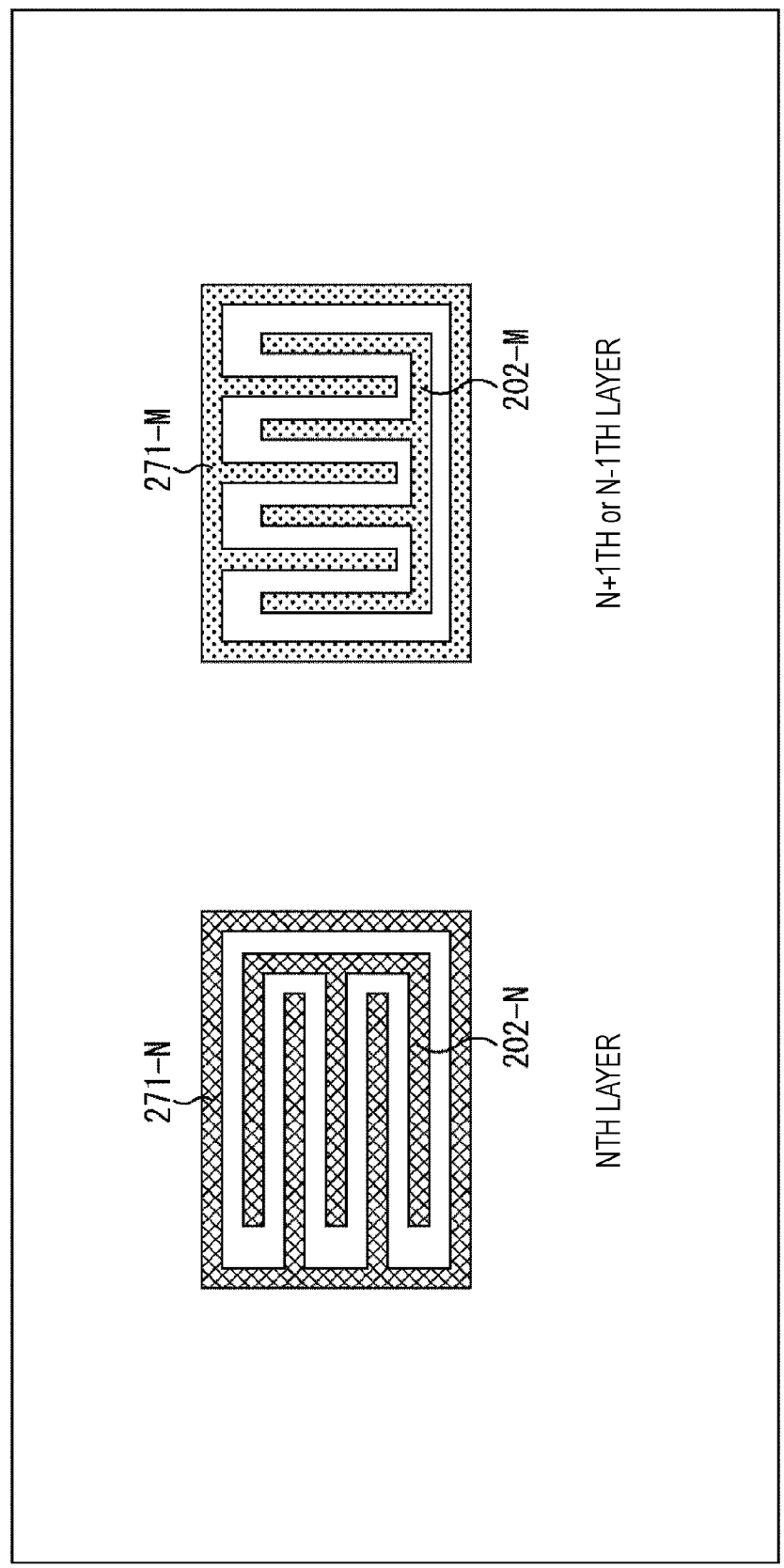
FIG. 14 is a diagram explaining a pixel of a sixth embodiment of the present disclosure.

FIG. 14 is a plan view showing an example of the wiring layout of adjacent wiring layers.

On the left side in FIG. 14, a wiring 202-N having a predetermined potential and a fixed potential line 271-N are shown as wirings formed in the wiring layer of the Nth layer.

The wiring 202-N is formed in a comb shape extending in the right-and-left direction in the drawing, and the fixed potential line 271-N is formed to have a comb-shaped portion facing the wiring 202-N and surround the wiring 202-N.

On the right side in FIG. 14, a wiring 202-M having a predetermined potential and a fixed potential line 271-M are shown as wirings formed in the wiring layer of the N+1th or N−1th layer adjacent to the wiring layer of the Nth layer.

The wiring 202-M is formed in a comb shape extending in the up-and-down direction in the drawing, and the fixed potential line 271-M is formed to have a comb-shaped portion facing the wiring 202-M and surround the wiring 202-M.

That is, the extension directions of the wiring 202-N and the fixed potential line 271-N of the wiring layer of the Nth layer and the wiring 202-M and the fixed potential line 271-M of the wiring layer of the N+1th or N−1th layer are perpendicular.

For example, in a case where the extension directions of the wirings running in parallel are set to be the same direction between adjacent wiring layers, the capacitance fluctuation in wiring capacitance formed by the wirings between the wiring layers becomes large when the wiring layout varies due to process variations.

On the other hand, as shown in FIG. 14, by making the extension directions of the wirings running in parallel perpendicular between the adjacent wiring layers, it is possible to reduce the capacitance fluctuation when the wiring layout varies due to process variations.

8. Seventh Embodiment

Figure 15:
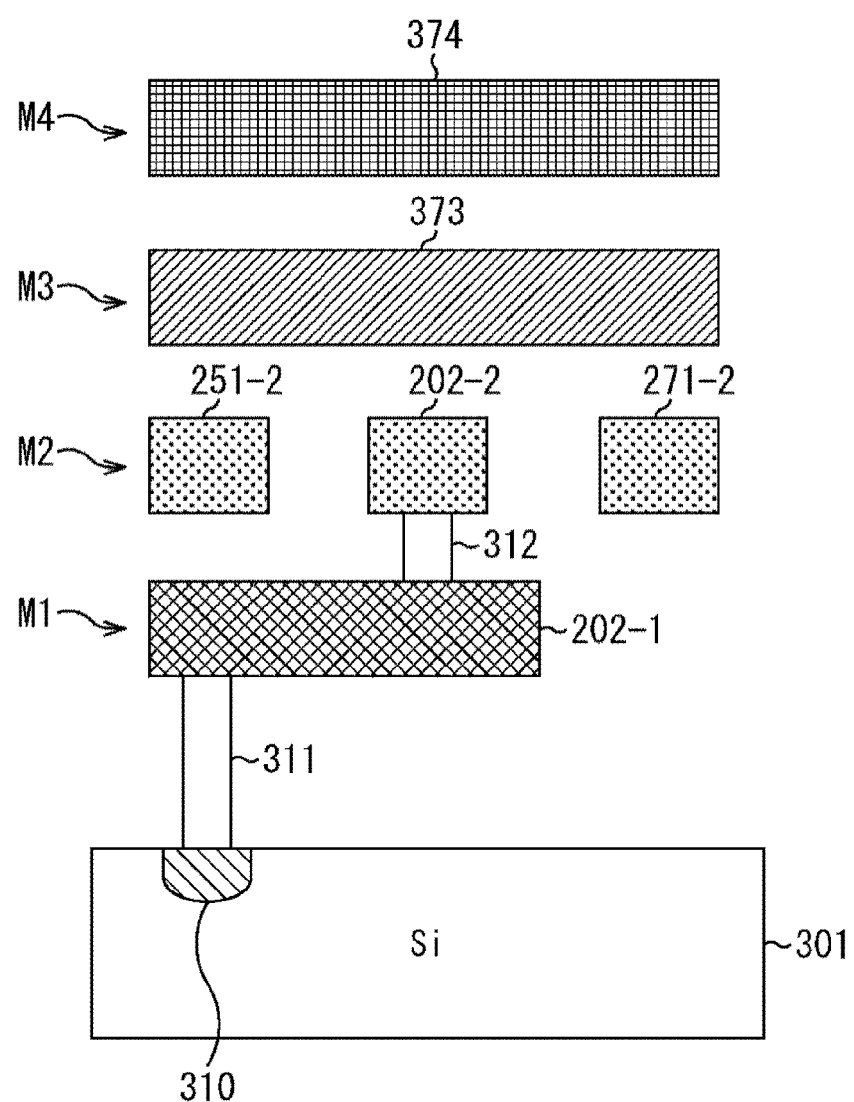
FIG. 15 is a diagram explaining a pixel of a seventh embodiment of the present disclosure.

FIG. 15 is a diagram showing still another example of the cross section of the wiring layer of the pixel 100. Furthermore, FIG. 16 is a plan view showing an example of the wiring layout of the wiring layer of FIG. 15.

Figure 16:
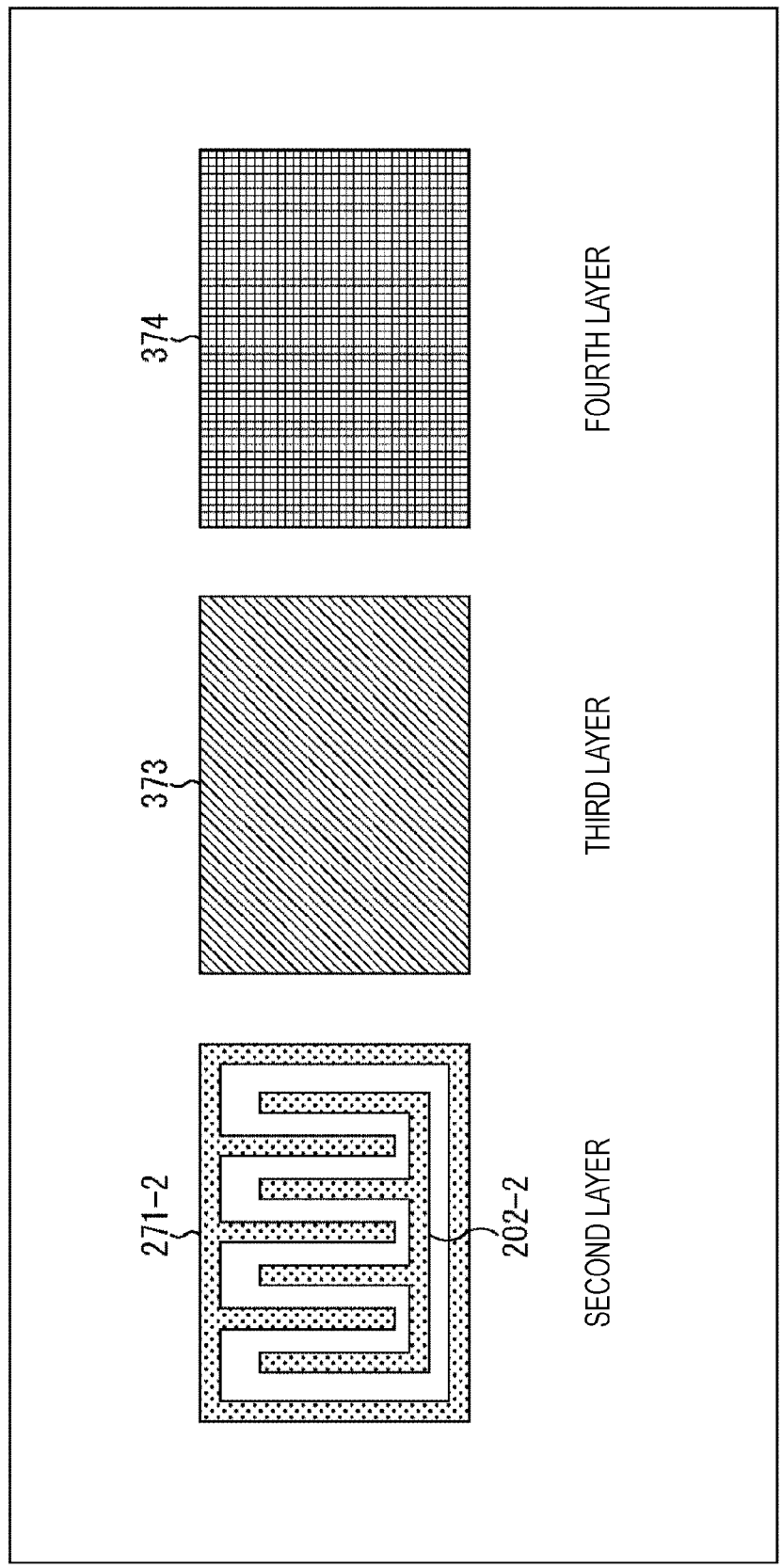
FIG. 16 is a diagram explaining a pixel of a seventh embodiment of the present disclosure.

In the examples of FIGS. 15 and 16, the wiring 202-2, the fixed potential line 271-2, and the like running in parallel are formed, and a solid wiring 373 is formed in the wiring layer M3, which is a layer above the wiring layer M2. Moreover, a solid wiring 374 connected to the fixed potential Vss is formed in the wiring layer M4, which is a layer above the wiring layer M3.

Therefore, in addition to increasing the capacitance of the charge holding unit, it is possible to improve the sensitivity of the PD by reflection of incident light with the solid wiring.

9. Eighth Embodiment

Figure 17:
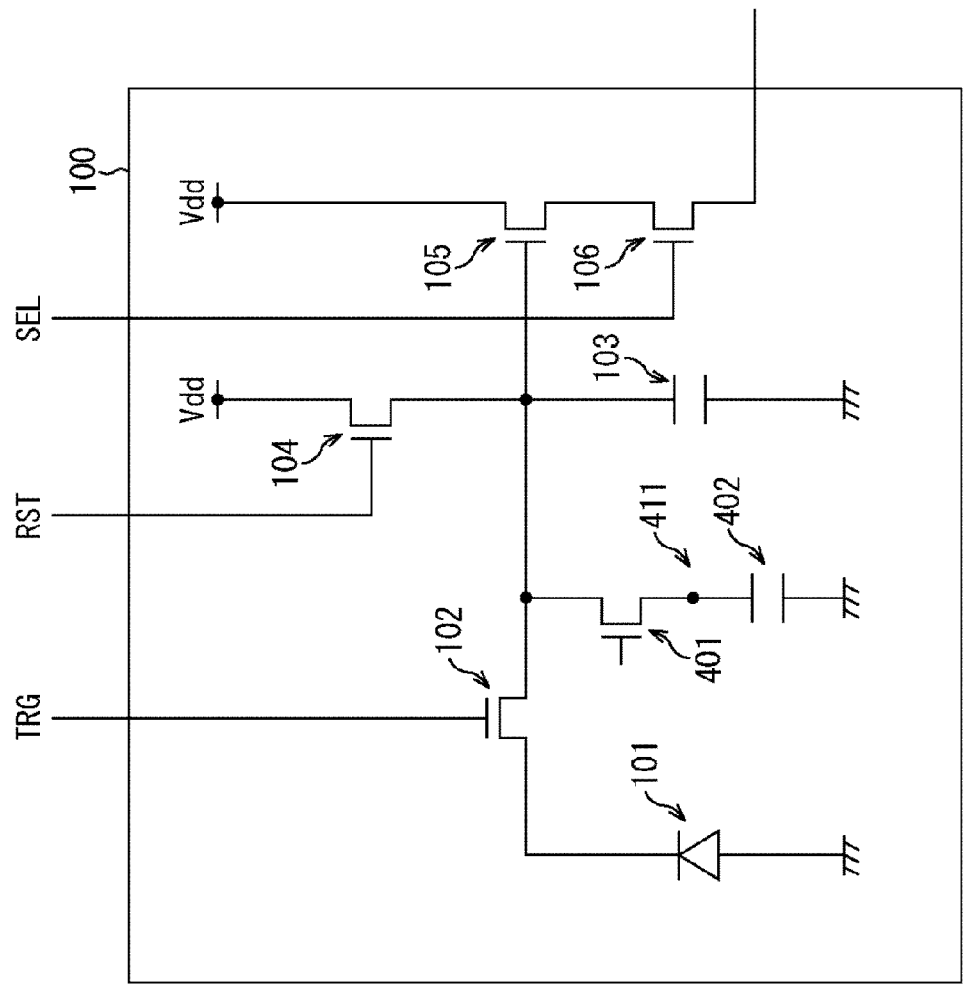
FIG. 17 is a diagram explaining a pixel of an eighth embodiment of the present disclosure.

FIG. 17 is a diagram showing another configuration example of the pixel 100.

The pixel 100 of FIG. 17 is different from the pixel 100 of FIG. 2 in that it includes a conversion efficiency switching switch 401 and a capacitance 402 instead of the charge holding units 107, 108.

A MOS transistor can be used for the conversion efficiency switching switch 401.

One end of the conversion efficiency switching switch 401 is connected to the drain of the transfer transistor 102, the gate of the amplification transistor 105, and the source of the reset transistor 104, and another end is connected to a node 411 having a predetermined potential.

The conversion efficiency switching switch 401 functions as a switch for switching the conversion efficiency. Furthermore, the capacitance 402 is formed by the wiring capacitance.

The additional capacitance of the FD 103 is enabled or disabled by turning the conversion efficiency switching switch 401 on or off. In a case where the conversion efficiency switching switch 401 is turned on, the additional capacitance including the capacitance of the conversion efficiency switching switch 401 itself, the diffusion capacitance, and the wiring capacitance (capacitance 402) becomes enabled. On the contrary, in a case where the conversion efficiency switching switch 401 is turned off, the additional capacitance becomes disabled.

The wiring layout according to the technology of the present disclosure can also be applied to the pixel 100 shown in FIG. 17. Therefore, it becomes possible to increase the capacitance of the capacitance 402.

10. Configuration Example of Electronic Device

For example, the aforementioned solid-state imaging element 1 can be applied to various types of electronic device including an imaging system, e.g., a digital still camera or a digital video camera, a mobile phone with an imaging function, and other device with an imaging function.

Figure 18:
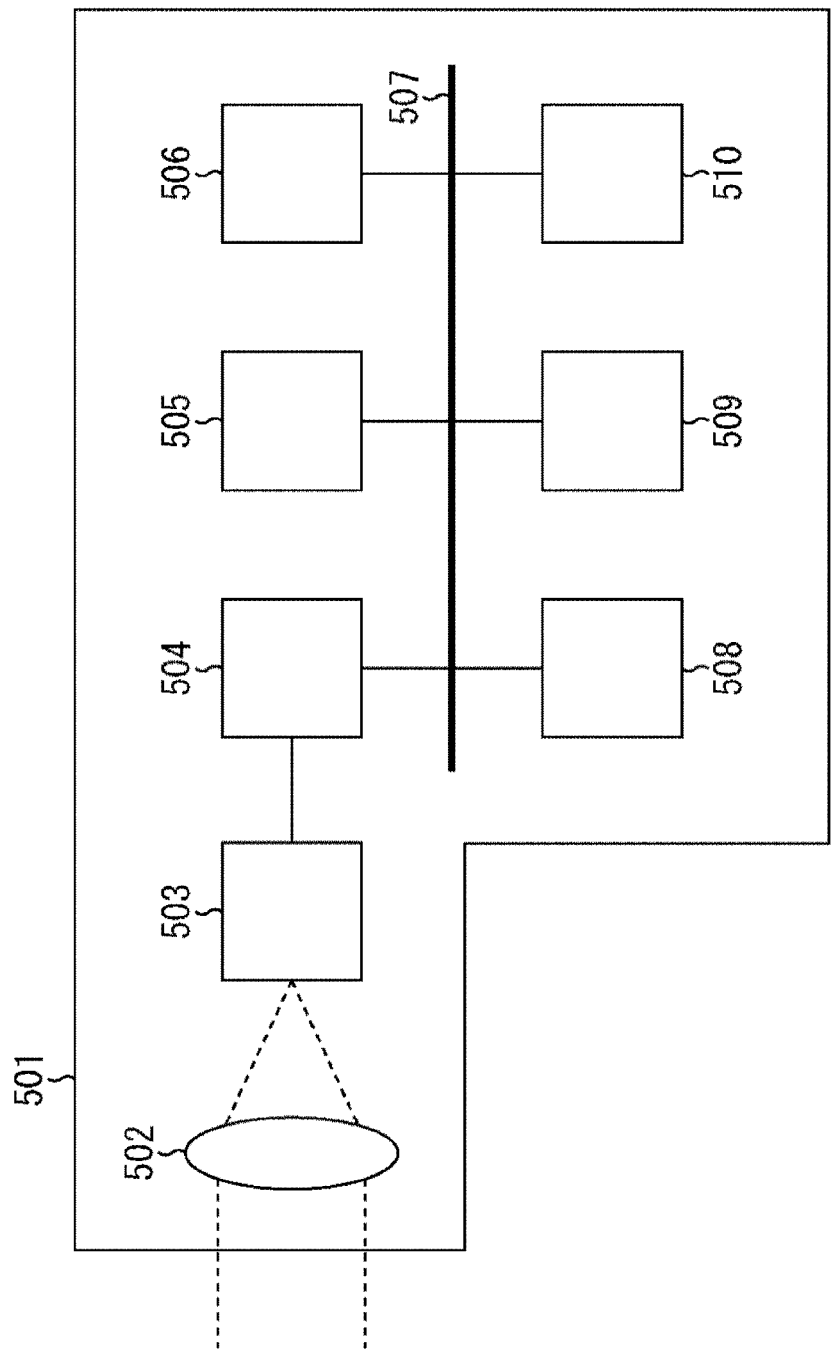
FIG. 18 is a diagram showing a configuration example of an electronic device to which the technology according to the present disclosure is applied.

FIG. 18 is a block diagram showing a configuration example of an imaging apparatus, which is an electronic device to which the present disclosure has been applied.

As shown in FIG. 18, an imaging apparatus 501 includes an optical system 502, a solid-state imaging element 503, and a digital signal processor (DSP) 504, and the DSP 504, a display apparatus 505, an operation system 506, a memory 508, a recording apparatus 509, and a power system 510 are connected via a bus 507, enabling capturing of still images and moving images.

The optical system 502 includes one or a plurality of lenses and guides imaging light (incident light) from an object to the solid-state imaging element 503 to form an image on the light receiving surface (sensor unit) of the solid-state imaging element 503.

As the solid-state imaging element 503, a solid-state imaging element 1 having pixels 21 of any of the above-described configuration examples is applied. Electrons are accumulated in the solid-state imaging element 503 for a certain period of time according to the image formed on the light receiving surface through the optical system 502. Then, a signal corresponding to the electrons accumulated in the solid-state imaging element 503 is supplied to the DSP 504.

The DSP 504 performs various signal processing on the signal from the solid-state imaging element 503 to acquire an image and causes the memory 508 to temporarily store the data of the image. The data of the image stored in the memory 508 is recorded in the recording apparatus 509 or supplied to and displayed on the display apparatus 505. Furthermore, the operation system 506 receives various operations by the user and supplies an operation signal to each block of the imaging apparatus 501, and the power system 510 supplies the electric power required for driving each block of the imaging apparatus 501.

In the imaging apparatus 501 configured in this way, by applying the solid-state imaging element 1 as described above as the solid-state imaging element 503, the capacitance of the charge holding unit can be increased and the kTC noise can be reduced, and it is possible to improve the image quality.

Note that an embodiment of the present disclosure is not limited to the aforementioned embodiment, but various changes may be made within a scope without departing from the gist of the present disclosure.

Moreover, the present disclosure may adopt the configuration described below.

(1)
A solid-state imaging element including:
   a pixel including
     a photodiode,
     an FD that accumulates charges generated in the photodiode, and
     a charge holding unit that is connected in parallel with the FD, in which
     the charge holding unit includes a wiring capacitance formed by parallel running of a first wiring connected to a first potential and a second wiring connected to a second potential different from the first potential.

(2)
The solid-state imaging element according to (1), in which
   the first wiring and the second wiring have an extending portion extending in one direction and a bent portion bending in a predetermined direction.

(3)
The solid-state imaging element according to (2), in which
   the bent portion of the first wiring and the second wiring is formed in any of an L-shape, a T-shape, a U-shape, and a cross shape.

(4)
The solid-state imaging element according to (3), in which
   the first wiring and the second wiring are formed in one or more wiring layers, and
   a part of the first wiring and the second wiring is formed directly above the photodiode.

(5)
The solid-state imaging element according to (4), in which
   a part of the first wiring and the second wiring is formed in the wiring layer of a first layer directly above a substrate.

(6)
The solid-state imaging element according to (5), in which
   a part of the first wiring and the second wiring is formed so that a line width and a distance are narrower than a wavelength to be captured.

(7)
The solid-state imaging element according to (6), in which
   each of a part of the first wiring and the second wiring is formed in a comb shape facing each other in a same wiring layer.

(8)
The solid-state imaging element according to any of (4) to (7), in which
   the second wiring is formed as at least one of an FD wiring connected to the FD, a fixed potential line, and a control line of a pixel transistor.

(9)
The solid-state imaging element according to (8), in which
   a potential of the fixed potential line includes GND.

(10)
The solid-state imaging element according to (8) or (9), in which
   the pixel transistor includes a transfer transistor.

(11)
The solid-state imaging element according to any of (8) to (10), in which
   the first wiring runs in parallel with the FD wiring to form a coupling capacitance with the FD.

(12)
The solid-state imaging element according to (11), in which
   the first wiring and the FD wiring are formed in a region surrounded by the fixed potential line or the control line.

(13)
The solid-state imaging element according to (12), in which
   the first wiring and the second wiring are formed in a same wiring layout in all the pixels.

(14)
The solid-state imaging element according to (13), in which
   the first wiring and the second wiring form the wiring capacitance in a same wiring layer.

(15)
The solid-state imaging element according to (13), in which
the first wiring and the second wiring form the wiring capacitance between different wiring layers.

(16)
The solid-state imaging element according to (13), in which
the first wiring and the second wiring form the wiring capacitance in a same wiring layer and between different wiring layers.

(17)
The solid-state imaging element according to (13), in which
extension directions of the first wiring and the second wiring are perpendicular between adjacent wiring layers.

(18)
The solid-state imaging element according to any of (13) to (17), in which
a high-k film is used as an insulating film between the first wiring and the second wiring.

(19)
The solid-state imaging element according to any of (13) to (18), in which
a diffusion layer in a substrate connected to the first wiring has a larger area than another diffusion layer forming the pixel transistor.

(20)
An electronic device including:
a solid-state imaging element including
a pixel including
a photodiode,
an FD that accumulates charges generated in the photodiode, and
a charge holding unit that is connected in parallel with the FD, in which
the charge holding unit includes a wiring capacitance formed by parallel running of a first wiring connected to a first potential and a second wiring connected to a second potential different from the first potential.

REFERENCE SIGNS LIST

1 Solid-state imaging element
100 Pixel
101 PD
102 Transfer transistor
103 FD
104 Reset transistor
105 Amplification transistor
106 Selection transistor
107, 108 Charge holding unit
201 Feedback transistor
202 Node
211, 212 Charge holding unit
202-1, 202-2, 202-3 Wiring
251-1, 251-2, 253-3 FD wiring
253-1, 253-2 Control line
271-1, 271-2, 273-3 Fixed potential line
501 Electronic device
503 Solid-state imaging element

What is claimed is:

1. A solid-state imaging element, comprising:
a pixel, including:
a photodiode;
a floating diffusion that accumulates charges generated in the photodiode; and
a charge holding unit,
wherein the charge holding unit includes a wiring capacitance formed by a first wiring connected to a first potential and a second wiring connected to a second potential different from the first potential,
wherein, in a plan view, at least a part of the first wiring and at least a part of the second wiring are surrounded by a third wiring that is connected to a fixed potential.

2. The solid-state imaging element according to claim 1, wherein a bent portion of the first wiring and the second wiring is formed in any of an L-shape, a T-shape, a U-shape, and a cross shape.

3. The solid-state imaging element according to claim 2, wherein the first wiring and the second wiring are formed in one or more wiring layers, and
wherein a part of the first wiring and the second wiring is formed directly above the photodiode.

4. The solid-state imaging element according to claim 3, wherein a part of the first wiring and the second wiring is formed in the wiring layer of a first layer directly above a substrate.

5. The solid-state imaging element according to claim 4, wherein a part of the first wiring and the second wiring is formed so that a line width and a distance between the first wiring and the second wiring are narrower than a wavelength to be captured.

6. The solid-state imaging element according to claim 3, wherein
the second wiring is formed as at least one of an FD wiring connected to the FD, a fixed potential line, and a control line of a pixel transistor.

7. The solid-state imaging element according to claim 6, wherein
a potential of the fixed potential line includes GND.

8. The solid-state imaging element according to claim 6, wherein
the pixel transistor includes a transfer transistor.

9. The solid-state imaging element according to claim 6, wherein the first wiring runs in parallel with the floating diffusion wiring to form a coupling capacitance with the floating diffusion.

10. The solid-state imaging element according to claim 9, wherein the first wiring and the floating diffusion wiring are formed in a region surrounded by the fixed potential line or the control line.

11. The solid-state imaging element according to claim 10, wherein the solid-state imaging element includes a plurality of pixels, and
wherein the first wiring and the second wiring are formed in a same wiring layout in all the pixels.

12. The solid-state imaging element according to claim 11, wherein the first wiring and the second wiring are in a same wiring layer as one another and form the wiring capacitance in that same wiring layer.

13. The solid-state imaging element according to claim 11, wherein the first wiring and the second wiring are in different wiring layers from one another and form the wiring capacitance between the different wiring layers.

14. The solid-state imaging element according to claim 2, wherein the first wiring and the second wiring are in a same wiring layer as one another and form the wiring capacitance in a same wiring layer and between different wiring layers.

15. The solid-state imaging element according to claim 11,
    wherein the first wiring and the second wiring are in different wiring layers,
    wherein extensions of the first wiring extend in a first direction,
    wherein extensions of the second wiring extend in a second direction, and
    wherein the first direction is perpendicular to the second direction.

16. The solid-state imaging element according to claim 11, wherein a film having a high dielectric constant is used as an insulating film between the first wiring and the second wiring.

17. The solid-state imaging element according to claim 2, wherein a diffusion layer is provided in a substrate, wherein the substrate is connected to the first wiring, and wherein the diffusion layer provided in the substrate has a larger area than another diffusion layer forming the pixel transistor.

18. A solid-state imaging element, comprising:
    a pixel, including:
        a photodiode;
        a floating diffusion that accumulates charges generated in the photodiode; and
        a charge holding unit that is connected in parallel with the floating diffusion,
    wherein the charge holding unit includes a wiring capacitance formed by parallel running of a first wiring connected to a first potential and a second wiring connected to a second potential different from the first potential,
    wherein the first wiring and the second wiring each have an extending portion extending in a first direction and a bent portion extending in a second direction,
    wherein the bent portion of the first wiring and the second wiring is formed in any of an L-shape, a T-shape, a U-shape, and a cross shape,
    wherein the first wiring and the second wiring are formed in one or more wiring layers,
    wherein a part of the first wiring and the second wiring is formed directly above the photodiode,
    wherein a part of the first wiring and the second wiring is formed in the wiring layer of a first layer directly above a substrate,
    wherein a part of the first wiring and the second wiring is formed so that a line width and a distance between the first wiring and the second wiring are narrower than a wavelength to be captured, and
    wherein each of a part of the first wiring and the second wiring is formed in a comb shape facing each other in a same wiring layer.

19. An electronic device, comprising:
    a solid-state imaging element, including:
        a pixel, including:
            a photodiode;
            a floating diffusion that accumulates charges generated in the photodiode; and
            a charge holding unit,
    wherein the charge holding unit includes a wiring capacitance formed by a first wiring connected to a first potential and a second wiring connected to a second potential different from the first potential,
    wherein, in a plan view, at least a part of the first wiring and at least a part of the second wiring are surrounded by a third wiring that is connected to a fixed potential.

* * * * *